(12) United States Patent
Liang et al.

(10) Patent No.: US 10,743,400 B2
(45) Date of Patent: Aug. 11, 2020

(54) ELECTRON STRIPPER FOILS AND PARTICLE ACCELERATORS HAVING THE SAME

(71) Applicant: General Electric Company, Schenectady, NY (US)

(72) Inventors: Yong Liang, Niskayuna, NY (US); Tomas Eriksson, Uppsala (SE); Vasile Neculaes, Niskayuna, NY (US); George Theodore Dalakos, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/726,929

(22) Filed: Oct. 6, 2017

(65) Prior Publication Data

US 2019/0110354 A1 Apr. 11, 2019

(51) Int. Cl.
*H05H 7/10* (2006.01)
*H05H 7/12* (2006.01)
(Continued)

(52) U.S. Cl.
CPC ............ *H05H 7/10* (2013.01); *C23C 16/26* (2013.01); *H05H 7/12* (2013.01); *H05H 2007/005* (2013.01); *H05H 2007/125* (2013.01)

(58) Field of Classification Search
CPC ............ G21G 1/10; G21K 5/08; H05H 13/00; H05H 13/005; H05H 13/02; H05H 2007/008; H05H 2007/025; H05H 2007/088; H05H 2007/122; H05H 2007/125; H05H 2277/116; H05H 6/00; H05H 7/00; H05H 7/001; H05H 7/04; H05H 7/10; H05H 7/12; H05H 7/14; H05H 2007/005; Y10T 29/49002; C23C 16/26

See application file for complete search history.

(56) References Cited

U.S. PATENT DOCUMENTS 6,152,075 A * 11/2000 Gardner ............... C23C 16/4409
118/504
2003/0011292 A1* 1/2003 Espinosa ................ B82Y 10/00
313/311

(Continued)

OTHER PUBLICATIONS

Stefan K. Zeisler, (Multilayer carbon foils for cyclotron beam extraction); www.sciencedirectassets.com; 2008 (Year: 2008).*

(Continued)

*Primary Examiner* — Renan Luque
(74) *Attorney, Agent, or Firm* — The Small Patent Law Group LLC; Dean D. Small

(57) ABSTRACT

System includes a particle accelerator configured to direct a particle beam of charged particles along a designated path. The system also includes an extraction device positioned downstream from the particle accelerator. The extraction device includes a stripper foil and a foil holder that holds the stripper foil. The foil holder is configured to position the stripper foil across the designated path of the particle beam such that the particle beam is incident thereon. The stripper foil is configured to remove electrons from the charged particles, wherein the stripper foil includes a backing layer and a conductive layer stacked with respect to one another. The backing layer includes synthetic diamond.

17 Claims, 12 Drawing Sheets

(51) Int. Cl.
C23C 16/26 (2006.01)
H05H 7/00 (2006.01)

(56) References Cited

U.S. PATENT DOCUMENTS

| | | | | |
|---|---|---|---|---|
| 2003/0104207 | A1* | 6/2003 | Arakida | G21K 1/14 428/408 |
| 2008/0285174 | A1* | 11/2008 | Shirotori | G11B 5/72 360/135 |
| 2008/0299307 | A1* | 12/2008 | Ward | B82Y 10/00 427/249.1 |
| 2010/0272977 | A1* | 10/2010 | Hasegawa | G21K 1/14 428/218 |
| 2011/0089335 | A1* | 4/2011 | Colard | G21K 1/14 250/423 R |
| 2011/0180720 | A1* | 7/2011 | Balakin | G21K 1/087 250/396 ML |
| 2013/0279638 | A1* | 10/2013 | Matsumoto | G21G 4/02 376/108 |
| 2015/0077022 | A1* | 3/2015 | Svedberg | H05H 13/005 315/502 |
| 2015/0305135 | A1* | 10/2015 | Korenev | H05H 7/001 250/396 R |
| 2018/0049306 | A1* | 2/2018 | Murakami | B32B 9/007 |
| 2018/0203139 | A1* | 7/2018 | Tatami | G01T 1/29 |

OTHER PUBLICATIONS

Barrowclough; (Analysis of Primary Stripper Foils at SNS by an Electron Beam Foil Test Stand) ; (Year: 2015 ).*

Borden et al.; "Carbon Stripper Foils used in the Los Alamos PSR," IEEE Particle Accelerator Conference; 1997. vol. 1; 3 pages.

Shaw et al.; "SNS Foil Development Program" U.S. Department of Energy; Feb. 2010; 23 pages.

Merchant et al.; "Production of Thin Carbon Stripper Foils using Heated-Substrates in a Cathodic Arc Deposition System," 3 pages.

Takeda et al.; "Development of Hybrid Type Carbon Stripper Foils with High Durability at .1800K for RCS of J-PARC," IEEE Particle Accelerator Conference, 2007; 3 pages.

Plum et al.; "Stripper foil failure modes and cures at the Oak Ridge Spallation Neutron Source," Physical Review Special Topics-Accelerators and Beams 14.3 (2011); 6 pages.

Korenev et al.; "The use of Graphene as Stripper Foils in Siemens Eclipse Cyclotrons," Proceedings of RuPAC2016, St. Petersburg, Russia; 2017; 3 pages.

Ren et al. "Chapter 1 Introduction to Carbon: Aligned Carbon Nanotubes: Physics, Concepts, Fabrication and Devices" Springer Science & Business Media; 2012 (6 pages).

Yeo et al. "Chapter 2 Overview of Amorphous Carbon Films:Ultrathin Carbon-Based Overcoats for Extremely High Density Magnetic Recording" Springer; 2017 (10 pages).

Luo et al. "Diamond and Diamond-Like Carbon MEMS" Journal of Micromechanics and Microengineering; 2007 (17 pages).

Breskin et al. "Absolute Photoyield from Chemical Vapor-Deposited Diamond and Diamond-Like Carbon Films in the UV" Applied Physics Letters; 1997 (3 pages).

Dearnaley et al. " Biomedical Applications of Diamond-Like Carbon (DLC) Coatings: A Review" Elsevier Surface & Coatings Technology; 2005 (7 pages).

Balmber et al. "Chemical Vapour Deposition Synthetic Diamond: Materials, Technology and Applications" Journal of Physics: Condensed Matter; 2009 (51 pages).

May "CVD Diamond: a New Technology for the Future" Elsevier Science; 1995 (6 pages).

Mezzi et al. "Surface Investigation of Carbon Films: From Diamond to Graphite" Surface Interface Analysis; 2010; 3 pages.

Martineau et al. "Identification of Synthetic Diamond Grown Using Chemical Vapor Deposition (CVD)" Gems and Gemology; 2004 (24 pages).

* cited by examiner

ELECTRON STRIPPER FOILS AND PARTICLE ACCELERATORS HAVING THE SAME

BACKGROUND OF THE INVENTION

The subject matter disclosed herein relates generally to particle accelerators, such as cyclotrons, and more particularly to particle accelerators that direct a beam of charged particles through a stripper foil that removes electrons from the charged particles.

Particle accelerators can be used to generate radionuclides for medical therapy and imaging and also for research in medicine and physics. A cyclotron is a type of particle accelerator and may be one part of a larger nuclide production system. Like other particle accelerators, the cyclotron accelerates a beam of charged particles (e.g., H-ions) and directs the beam into a starting material to generate the isotopes. The cyclotron is a complex system that uses electrical and magnetic fields to accelerate and guide the charged particles along a predetermined orbit within an evacuated acceleration chamber. When the beam of charged particles reaches an outer portion of the orbit, the beam of charged particles passes through a sheet of material (referred to as a "stripper foil") that removes electrons from the charged particles. The beam of particles, no longer guided by the electrical field, exits the orbit toward, for example, a target assembly.

The target assembly for nuclide production includes a chamber (referred to as a production chamber) that holds a starting material, which may be a liquid, gas, or solid material. The target assembly has a beam passage that receives the beam and permits the beam to be incident on the starting material in the production chamber. To contain the starting material within the production chamber, the beam passage is separated from the production chamber by another sheet of material (referred to herein as a "target foil"). More specifically, the production chamber may be defined by a void within a target body. The target foil covers the void on one side. The particle beam passes through the target foil and is incident upon the starting material within the production chamber.

In many cases, another foil (referred to herein as a "front foil") may be used. The front foil is sometimes described as a "degrader foil" or "vacuum foil." The front foil is positioned downstream from the stripper foil, but upstream from the target foil such that the beam of particles intersects the front foil prior to intersecting the target foil. The front foil reduces the energy of the particle beam and separates the target assembly from the vacuum of the cyclotron.

Each of the various foils may consist of only a single material composition (e.g., a single layer of the same material). Target foils may comprise two or more layers (e.g. metal sheet coated with another layer). Due to different purposes and environments, the foils often have different qualities, such as different thicknesses and type(s) of material. For example, target foils can experience an elevated pressure along the side of the target foil that borders the production chamber. Target foils may also experience a corrosive and oxidizing environment due to contact with the starting material. The elevated temperatures and pressures cause stress that renders the target foil vulnerable to rupture, melting, or other damage. Target foils may also contaminate the target media when the ions from the target foil are absorbed by the starting material. The front foils may be configured to, among other things, reduce the energy of the particle beam by a designated amount.

Stripper foils are also susceptible to degradation. Graphite foils, for example, have been used as electron strippers to convert negatively-charged hydrogen ions to protons. Over time, however, cyclical ion-beam exposures cause the graphite foils to wrinkle and/or fracture and become unsuitable for use. A stripper foil with a longer lifetime would reduce downtime of the nuclide production system and lower overall costs for operating the system while also reducing radiation exposure to service personnel.

BRIEF DESCRIPTION OF THE INVENTION

In one embodiment, a system is provided that includes a particle accelerator configured to direct a particle beam of charged particles along a designated path. The system also includes an extraction device positioned downstream from the particle accelerator. The extraction device includes a stripper foil and a foil holder that holds the stripper foil. The foil holder is configured to position the stripper foil across the designated path of the particle beam such that the particle beam is incident thereon. The stripper foil is configured to remove electrons from the charged particles, wherein the stripper foil includes a backing layer and a conductive layer stacked with respect to one another. The backing layer includes synthetic diamond.

In some aspects, the conductive layer is deposited directly along the synthetic diamond or on an intermediate layer between the conductive layer and the synthetic diamond.

In some aspects, the synthetic diamond is a polycrystalline diamond ($sp^3$-hybridized) and the conductive layer comprises electrically-conductive carbon layer.

In some aspects, the conductive layer includes at least one of graphite, graphene, amorphous carbon, or diamond-like carbon (DLC).

In some aspects, the stripper foil has an outer edge and also includes a support section extending along at least a portion of the outer edge. The support section is formed directly on the conductive layer or directly on an intermediate layer between the support section and the conductive layer. The support section allows the charged particles to pass through the conductive layer and the backing layer.

In some aspects, the stripper foil also includes an intermediate layer positioned between the backing layer and the conductive layer. The intermediate layer increases adhesion between the backing layer and the conductive layer.

In some aspects, the conductive layer is a first conductive layer. The stripper foil also includes a second conductive layer, wherein the backing layer is disposed between the first and second conductive layers.

In an embodiment, a stripper foil is provided that includes a conductive layer and a backing layer stacked with respect to the conductive layer. The backing layer includes synthetic diamond. The conductive and backing layers form a stripping sheet that is configured to strip electrons from charged particles passing through the stripping sheet.

In some aspects, the stripping sheet has an outer edge formed by the conductive layer and the backing layer. The stripper foil also includes a support section extending along at least a portion of the outer edge. The support section covers only a portion of the stripping sheet thereby allowing the charged particles to pass through the conductive layer and the backing layer.

In some aspects, the conductive layer is deposited directly on the synthetic diamond or directly on an intermediate layer between the conductive layer and the synthetic diamond.

In some aspects, the conductive layer has a thickness that is at most 2000 nanometers and the backing layer has a thickness that is at most 50 micrometers.

In some aspects, the conductive layer includes an electrically-conductive carbon layer.

In some aspects, an intermediate layer is positioned between the backing layer and the conductive layer. The intermediate layer increases adhesion between the backing layer and the conductive layer, wherein the intermediate layer and the conductive layer are carbon layers capable of being consecutively deposited by a same deposition apparatus.

In some aspects, the conductive layer is a first conductive layer. The stripping sheet also includes a second conductive layer, wherein the backing layer is disposed between the first and second conductive layers.

In an embodiment, a method is provided that includes providing a substrate layer and depositing a first layer along an exposed side of the substrate layer. The method also includes depositing a second layer along an exposed side of the first layer such that the first layer is disposed between the substrate layer and the second layer, wherein one of the first or second layers is a backing layer and the other is a conductive layer. The first and second layers form a stripping sheet that is configured to strip electrons from charged particles passing through the stripping sheet. The method also includes removing at least a portion of the substrate layer.

In some aspects, depositing the first layer and depositing the second layer use a same chemical vapor deposition (CVD) apparatus in which one or more operating parameters are different for the first and second layers.

In some aspects, depositing the first layer and depositing the second layer use a same chemical vapor deposition (CVD) apparatus in which one or more operating parameters gradually change between depositing the first layer and depositing the second layer.

In some aspects, the operating parameters include at least one of a plasma discharge power, a composition of reactant gas, a composition of the substrate layer, a temperature of the substrate layer, an electrical bias of the substrate layer, a temperature of a filament, a flow rate of the reactant gas, or a system pressure.

In some aspects, the stripping sheet has an outer edge. The method also includes providing a support section that extends along at least a portion of the outer edge, the support section covering only a portion of the stripping sheet thereby allowing the charged particles to pass therethrough.

In some aspects, the method also includes depositing an intermediate layer. The intermediate layer is positioned between the first and second layers and increases adhesion between the first and second layers.

DETAILED DESCRIPTION OF THE INVENTION

Embodiments described herein include particle accelerators, nuclide production systems, extraction devices, and stripper foils. The stripper foils may include two or more layers in which at least one layer is a backing layer and at least one layer is a conductive layer. In some embodiments, the backing layer is disposed between two conductive layers. The backing layer may provide designated mechanical properties of the stripper foil. The conductive layer provides a path to ground for a charge that may develop due to the accumulation of electrons. More specifically, the backing layer may be relatively insulative such that, without the conductive layer, a voltage build-up (e.g., up to several megavolts or more) along the stripper foil may reduce the lifetime of the stripper foil. In some embodiments, an additional layer is shaped to form a support section (or support frame) that may also provide designated mechanical properties.

At least one technical effect includes is a stripper foil having a longer operational lifetime compared to conventional stripper foils, such as graphite foils. Another technical effect may include a more efficient (or less costly) operation of the particle accelerator. Yet another technical effect may include a reduced amount of radiation exposure to service personnel. Embodiments may exhibit at least one of improved thermal properties, improved mechanical properties, or improved radiation-hardness properties compared to conventional stripper foils. The electrical conductance may be sufficient and embodiments may have a low atomic number for electron stripping.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements that do not have that property.

Figure 1:
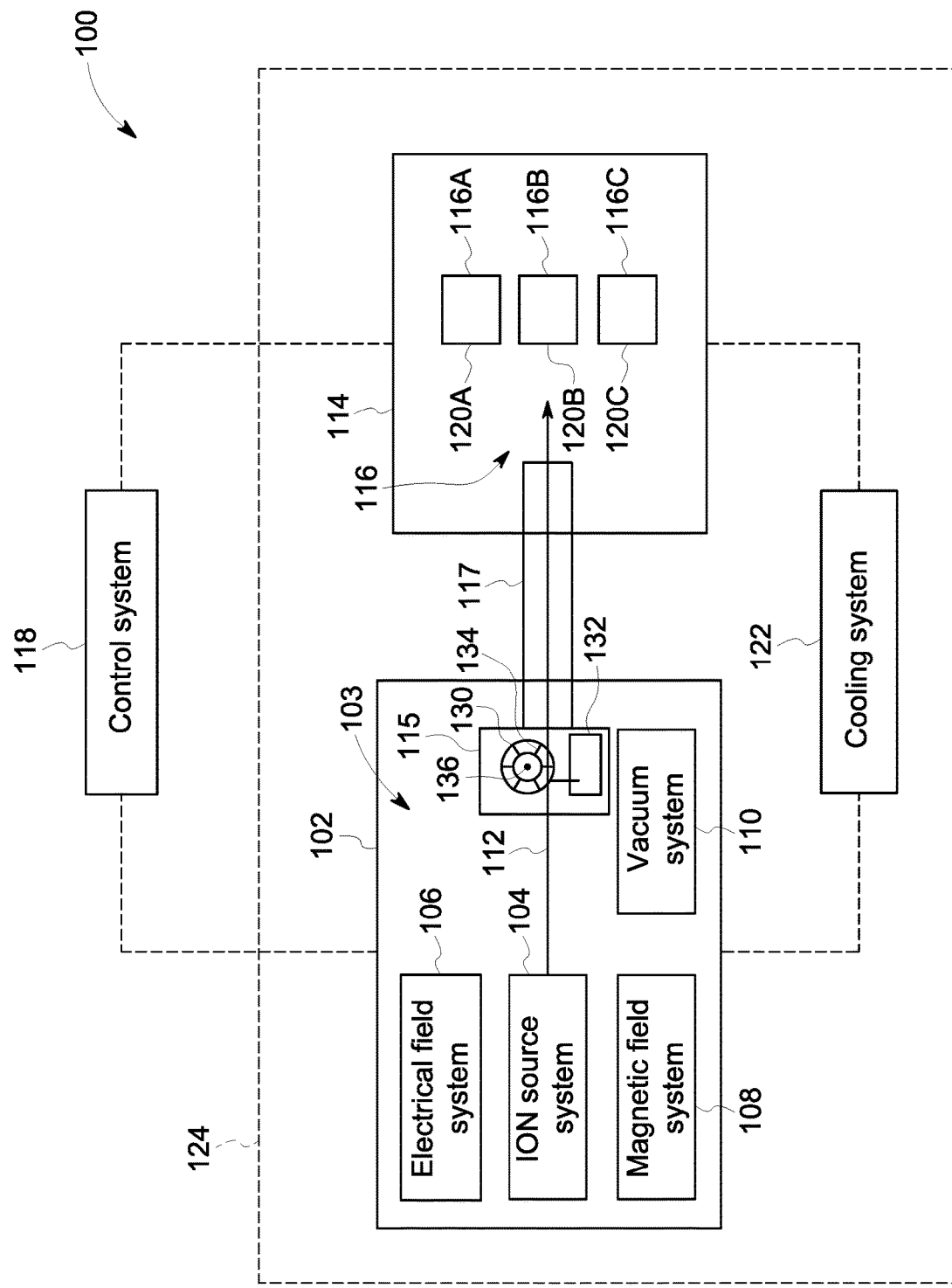
FIG. 1 is a block diagram of a nuclide production system in accordance with an embodiment.

FIG. 1 is a block diagram of a system 100 formed in accordance with one embodiment. In the illustrated embodiment, the system 100 is a nuclide production system configured to generate batches for medical imaging. It should be understood, however, that other embodiments may be used for different applications or purposes. The system 100 includes a particle accelerator 102 that has several sub-systems including an ion source system 104, an electrical field system 106, a magnetic field system 108, and a vacuum system 110. The particle accelerator 102 may be, for example, a cyclotron or, more specifically, an isochronous cyclotron. The particle accelerator 102 may include an acceleration chamber 103. The acceleration chamber 103 may be defined by a housing portion or other portions of the particle accelerator and is configured to have an evacuated state during operation. The particle accelerator shown in FIG. 1 has at least portions of the sub-systems 104, 106, 108, and 110 located in the acceleration chamber 103.

Examples of systems and/or particle accelerators described herein may be found in U.S. Patent Application Publication No. 2011/0255646, which is incorporated herein by reference in its entirety. Furthermore, systems and/or particle accelerators that may be used with embodiments described herein are also described in U.S. patent application Ser. Nos. 12/492,200; 12/435,903; 12/435,949; U.S. Patent Application Publication No. 2010/0283371 A1 and U.S. patent application Ser. Nos. 14/754,878, 14/995,772, and 15/044,397, each of which is incorporated herein by reference in its entirety.

During use of the particle accelerator 102, charged particles are placed within or injected into the acceleration chamber 103 of the particle accelerator 102 through the ion source system 104. The magnetic field system 108 and the electrical field system 106 generate respective fields that cooperate in producing a particle beam 112 of the charged particles. The charged particles are accelerated and guided within the acceleration chamber 103 along a predetermined or designated path. In cyclotrons, for example, the designated path may be a spiral-like orbit.

The magnetic field system 108 may include, for example, a magnetic yoke and electromagnetic coils. The electrical field system 106 may include, for example, radio-frequency (RF) electrodes that form a resonant system including inductive and capacitive elements tuned to a predetermined frequency. The electrical field system 106 may also include a high frequency power generator (not shown) having a frequency oscillator in communication with one or more amplifiers. The magnetic fields generated by the magnetic yoke and electromagnetic coils may facilitate in guiding the charged particles. Such systems and/or particle accelerators are described in U.S. patent application Ser. Nos. 14/754,878, 14/995,772, and 15/044,397, each of which is incorporated herein by reference in its entirety.

Also shown in FIG. 1, the system 100 has an extraction system 115 and a target system 114 that includes a starting material 116. In some embodiments, the particle accelerator 102 and the target system 114 may be enclosed or housed within a single system housing 124 (indicated by broken lines. However, the target system 114 may be separate from the particle accelerator 102 in other embodiments. The extraction system 115 may be positioned at an edge of the spiral-like orbit. The extraction system 115 includes a foil holder 130 and a rotating motor 132 that is operably coupled to the foil holder 130. The foil holder 130 is illustrated as a revolving device or carousel, but other foil holders may be used in other embodiments. The foil holder 130 is configured to hold one or more stripper foils 134 (a plurality of stripper foils 134 is shown in FIG. 1). The rotating motor 132 is configured to selectively move the foil holder 130 about an axis of rotation 136 to designated rotational positions. For example, the foil holder 130 may be rotated so that different stripper foils 134 are incident on the charged particles. The rotating motor 132 may be, for example, an electromechanical motor that is driven by piezoelectric elements as set forth in U.S. application Ser. No. 12/977,208, which is incorporated by reference in its entirety.

As shown, the target system 114 is positioned adjacent to the particle accelerator 102. To generate isotopes, the charged particles are directed by the particle accelerator 102 to be incident on the stripper foil 134 of the extraction system 115. For some embodiments, when the charged particles (e.g., negative hydrogen ions) are incident upon the stripper foil 134, electrons of the charged particles may be stripped from the charged particle thereby changing the charge of the particle. The particles may then be directed along a beam passage 117 and into the target system 114 so that the particle beam 112 is incident upon the starting material 116 located at a corresponding target location 120. In alternative embodiments, the system 100 may have a target system located within or directly attached to the accelerator chamber 103.

By way of example, the system 100 may use $^1H^-$ technology and brings the charged particles to a designated energy (e.g., 8-20 MeV) with a beam current of at least 10 μA. Negative hydrogen ions may be accelerated and guided through the particle accelerator 102 and into the extraction system 115. The negative hydrogen ions may then hit the stripper foil 134 of the extraction system 115 thereby removing the pair of electrons and making the particle a positive ion, $^1H^+$. It is noted, however, embodiments described herein may be applicable to other types of particle accelerators and cyclotrons.

One or more embodiments may permit using higher beam currents. For example, in some embodiments, the beam current may be at most 1500 μA or at most 1000 μA. In some embodiments, the beam current may be at most 500 μA or at most 250 μA. In some embodiments, the beam current may be at most 125 μA or at most 100 μA. In some embodiments, the beam current may be at most 75 μA or at most 50 μA. Embodiments may also use lower beam currents. By way of example, the beam current may be between about of approximately 10-30 μA.

When the particle beam 112 is incident upon the stripper foil 134, the stripper foil 134 may experience a significant rise in temperature. For example, the stripper foil 134 may experience an increase in temperature of about 750K or more. Significant temperature changes may cause portions of the stripper foil 134 to expand (or contract) in size.

Also shown in FIG. 1, the system 100 may have multiple target locations 120A-C where separate starting materials 116A-C are located. A shifting device or system (not shown) may be used to shift the target locations 120A-C with respect to the particle beam 112 so that the particle beam 112 is incident upon a different starting material 116. A vacuum may be maintained during the shifting process as well. Alternatively, the particle accelerator 102 and the extraction system 115 may not direct the particle beam 112 along only one path, but may direct the particle beam 112 along a unique path for each different target location 120A-C. Furthermore, the beam passage 117 may be substantially linear from the particle accelerator 102 to the target location 120 or, alternatively, the beam passage 117 may curve or turn at one or more points therealong. For example, magnets positioned alongside the beam passage 117 may be configured to redirect the particle beam 112 along a different path.

The system 100 is configured to produce radionuclides that may be used in medical imaging, research, and therapy, but also for other applications that are not medically related, such as scientific research or analysis. The system 100 may produce the isotopes in predetermined amounts or batches, such as individual doses for use in medical imaging or therapy. When used for medical purposes, such as in Nuclear Medicine (NM) imaging or Positron Emission Tomography (PET) imaging, the radioisotopes may also be called tracers. By way of example, the nuclide production system 100 may generate $^{68}$Ga isotopes from a target liquid comprising $^{68}$Zn nitrate in dilute acid (e.g., nitric acid). The nuclide production system 100 may also be configured to generate protons to make [$^{18}$F]F$^-$ in liquid form. The starting material may be enriched $^{18}$O water for the production of $^{18}$F using the $^{18}$O(p, n)$^{18}$F nuclear reaction. In some embodiments, the nuclide production system 100 may also generate protons or deuterons in order to produce $^{15}$O labeled water. Isotopes having different levels of activity may be provided. $^{13}$N may be produced by proton bombardment of distilled water through the $^{16}$O(p,a)$^{13}$N nuclear reaction. As yet another example, the starting material may be a gas for the production of $^{11}$C via the $^{14}$N(p,a)$^{11}$C reaction.

The system 100 may also include a control system 118 that may be used by a technician to control the operation of the various systems and components. The control system 118 may include one or more user-interfaces that are located proximate to or remotely from the particle accelerator 102 and the target system 114. In some embodiments, the control system 118 may be configured to receive data regarding the operability or suitability of the stripper foil 134. For instance, the control system 118 may inform a use that the stripper foil 134 has failed and that a new stripper foil 134 should be positioned within the path of the charged particles. Such information may be obtained by detecting a current from the stripper foil 134. In some embodiments, the control system 118 may automatically rotate the foil holder 130 so that a different stripper foil 134 is positioned within the path.

Although not shown in FIG. 1, the system 100 may also include one or more radiation and/or magnetic shields for the particle accelerator 102 and the target system 114. The system 100 may include a cooling system 122 that transports a cooling or working fluid to various components of the different systems in order to absorb heat generated by the respective components.

The nuclide production system 100 may be configured to accelerate the charged particles to a predetermined energy level. For example, some embodiments described herein accelerate the charged particles to an energy of at most 75 MeV, at most 50 MeV, or at most 25 MeV. In particular embodiments, the nuclide production system 100 accelerates the charged particles to an energy of approximately at most 18 MeV or at most 16.5 MeV. In particular embodiments, the nuclide production system 100 accelerates the charged particles to an energy of approximately at most 9.6 MeV. In more particular embodiments, the nuclide production system 100 accelerates the charged particles to an energy of at most 7.8 MeV. However, embodiments describe herein may also have a higher beam energy. For example, embodiments may have a beam energy above 100 MeV, 500 MeV, or more.

The system 100 and, more specifically, the particle accelerator 102 may include features described in U.S. application Ser. No. 12/977,208, which is incorporated by reference in its entirety.

One or more processes may be used to make the stripper foils, including the support section. The support section may include, for example, a silicon material. The processes may be additive or subtractive processes in which layers (or portions thereof) are added or subtracted, respectively, from a working substrate. The term "working substrate" is used to describe an intermediate object that is made during the manufacture of the stripper foil. The term "working substrate" includes a plurality of stacked substrate layers in which at least one of the substrate layers is being used to form the stripper foil.

The following describes different methods of manufacturing a stripper foil. It should be understood that various aspects or steps of one method of manufacturing the stripper foil may be combined with aspects or steps of another method. At least one of the layers may be formed using one or more processes that are similar to, for example, the processes used to manufacture integrated circuits, semiconductors, and/or microelectromechanical systems (MEMS). For example, lithography (e.g., photolithography) is one category of techniques or processes that may be used.

One or more processes for manufacturing the stripper foils may include subtractive techniques in which material is removed from a working substrate. In addition to lithography, such processes include (1) chemical techniques, such as dry chemical etching, reactive ion etching (RIE), vapor phase etching, chemical machining (CM), anisotropic wet chemical etching, wet photoetching; (2) electrochemical techniques, such as electrochemical etching (ECM), electrochemical grinding (ECG), photoelectrochemical etching; (3) thermal techniques, such as laser machining, electron beam machining, electrical discharge machining (EDM); and (4) mechanical techniques, such as physical dry etching, sputter etching, ion milling, water-jet machining (WJM), abrasive water-jet machining (AWJM), abrasive jet machining (AJM), abrasive grinding, electrolytic in-process dressing (ELID) grinding, ultrasonic drilling, focused ion beam (FIB) milling, and the like. The above list is not intended to be limiting and other subtractive techniques or processes may be used.

One or more processes for fabricating the stripper foils may include additive techniques in which material is added to a working substrate. Such processes include PVD, evaporation (e.g., thermal evaporation), sputtering, ion plating, ion cluster beam deposition, pulsed laser deposition, laser ablation deposition, molecular beam epitaxy, chemical vapor deposition (CVD) (e.g., plasma CVD, DC discharge, radio-frequency (RF) CVD, microwave CVD, flame (combustion) CVD, or hot-filament CVD), atomic layer deposition (ALD), epitaxy (e.g., liquid-phase epitaxy, solid-phase epitaxy), anodization, thermal spray deposition, laser sputter deposition. The above list is not intended to be limiting and other additive techniques or processes may be used.

In some cases, one or more processes may provide stripper foils with physical characteristics that identify the process(es). For example, a scanning electron microscope (SEM) or other imaging system may be used to capture a magnified image of the stripper foil, such as a sliced portion that reveals a cross-section of the stripper foil. The image of the stripper foil may show physical characteristics that are indicative of a process used to manufacture the stripper foil. Accordingly, one or more claims to an apparatus (e.g., stripper foil) may recite the method used to manufacture the stripper foil. Such a recitation is toward the physical (or structural) characteristics caused by the method of manufacturing.

Figure 2:
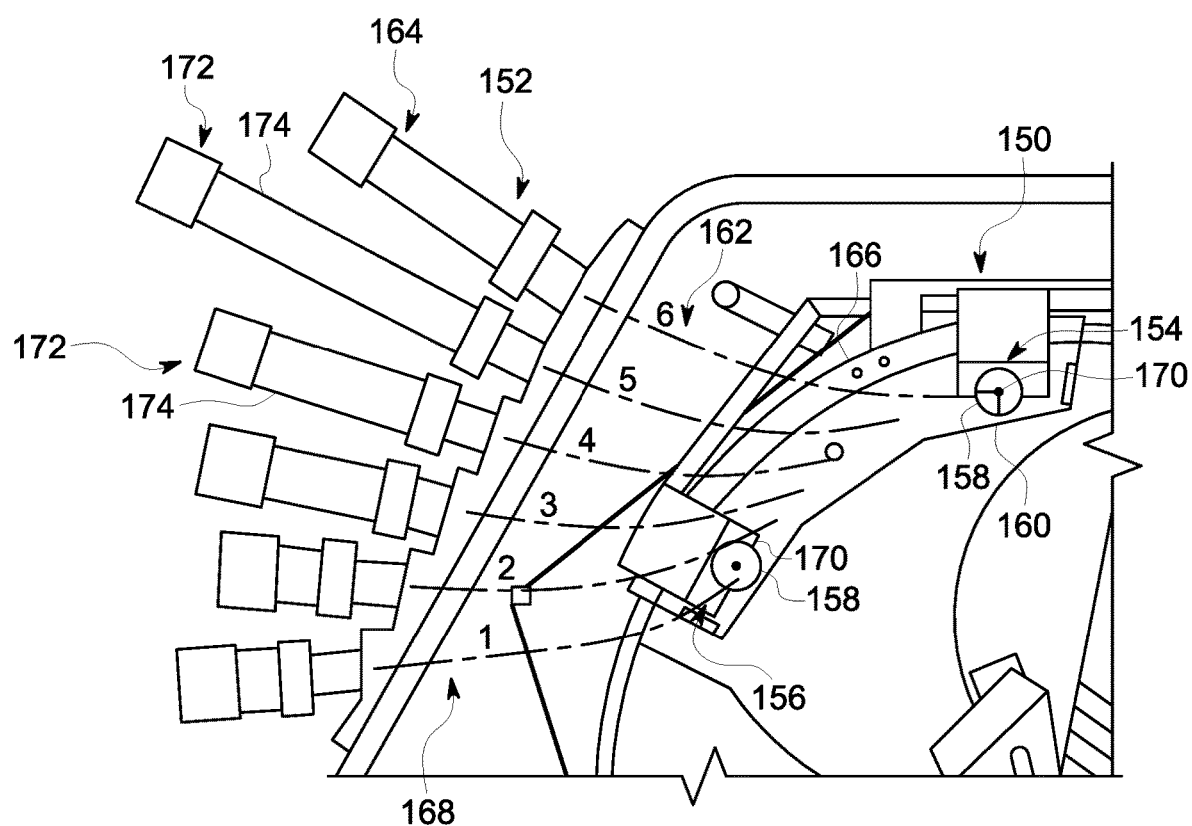
FIG. 2 is a side view of an extraction system and a target system that may be used with the particle accelerator of FIG. 1.

FIG. 2 is a side view of the extraction system 150 and the target system 152. In the illustrated embodiment, the extraction system 150 includes first and second extraction units 156, 158 that each includes a foil holder 158 and one or more stripper foils 160 (also referred to as stripper foils). The extraction process may be based on a stripping-foil principle. More specifically, the electrons of the charged particles (e.g., the accelerated negative ions) are stripped as the charged particles pass through the stripper foil 160. The charge of the particles is changed from a negative charge to a positive charge thereby changing the trajectory of the particles in the magnet field. The stripper foils 160 may be positioned to control a trajectory of an external particle beam 162 that includes the positively-charged particles and may be used to steer the external particle beam 162 toward designated target locations 164.

In the illustrated embodiment, the foil holders 158 are rotatable carousels that are capable of holding one or more stripper foils 160. However, the foil holders 158 are not required to be rotatable. The foil holders 158 may be selectively positioned along a track or rail 166. The extraction system 150 may have one or more extraction modes. For example, the extraction system 150 may be configured for single-beam extraction in which only one external particle beam 162 is guided to an exit port 168. In FIG. 2, there are six exit ports 168, which are enumerated as 1-6.

The extraction system 150 may also be configured for dual-beam extraction in which two external beams 162 are guided simultaneously to two exit ports 168. In a dual-beam mode, the extraction system 150 may selectively position the extraction units 156, 158 such that each extraction unit intercepts a portion of the particle beam (e.g., top half and bottom half). The extraction units 156, 158 are configured to move along the track 166 between different positions. For example, a drive motor may be used to selectively position the extraction units 156, 158 along the track 166. Each extraction unit 156, 158 has an operating range that covers one or more of the exit ports 168. For example, the extraction unit 156 may be assigned to the exit ports 4, 5, and 6, and the extraction unit 158 may be assigned to the exit ports 1, 2, and 3. Each extraction unit may be used to direct the particle beam into the assigned exit ports.

The foil holders 158 may be insulated to allow for current measurement of the stripped-off electrons. The stripper foils 160 are located at a radius of the beam path where the beam has reached a final energy. In the illustrated embodiment, each of the foil holders 158 holds a plurality of stripper foils 160 (e.g., six foils) and is rotatable about an axis 170 to enable positioning different stripper foils 160 within the beam path.

The target system 152 includes a plurality of target assemblies 172. A total of six target assemblies 172 are shown and each corresponds to a respective exit port 168. When the particle beam 162 has passed the selected stripper foil 160, it will pass into the corresponding target assembly 172 through the respective exit port 168. The particle beam enters a target chamber (not shown) of a corresponding target body 174. The target chamber holds the starting material (e.g., liquid, gas, or solid material) and the particle beam is incident upon the starting material within the target chamber. The particle beam may first be incident upon one or more target foils within the target body 174, as described in greater detail below. The target assemblies 172 are electrically insulated to enable detecting a current of the particle beam when incident on the starting material, the target body 174, and/or the target foils or other foils within the target body 174.

Figure 3:
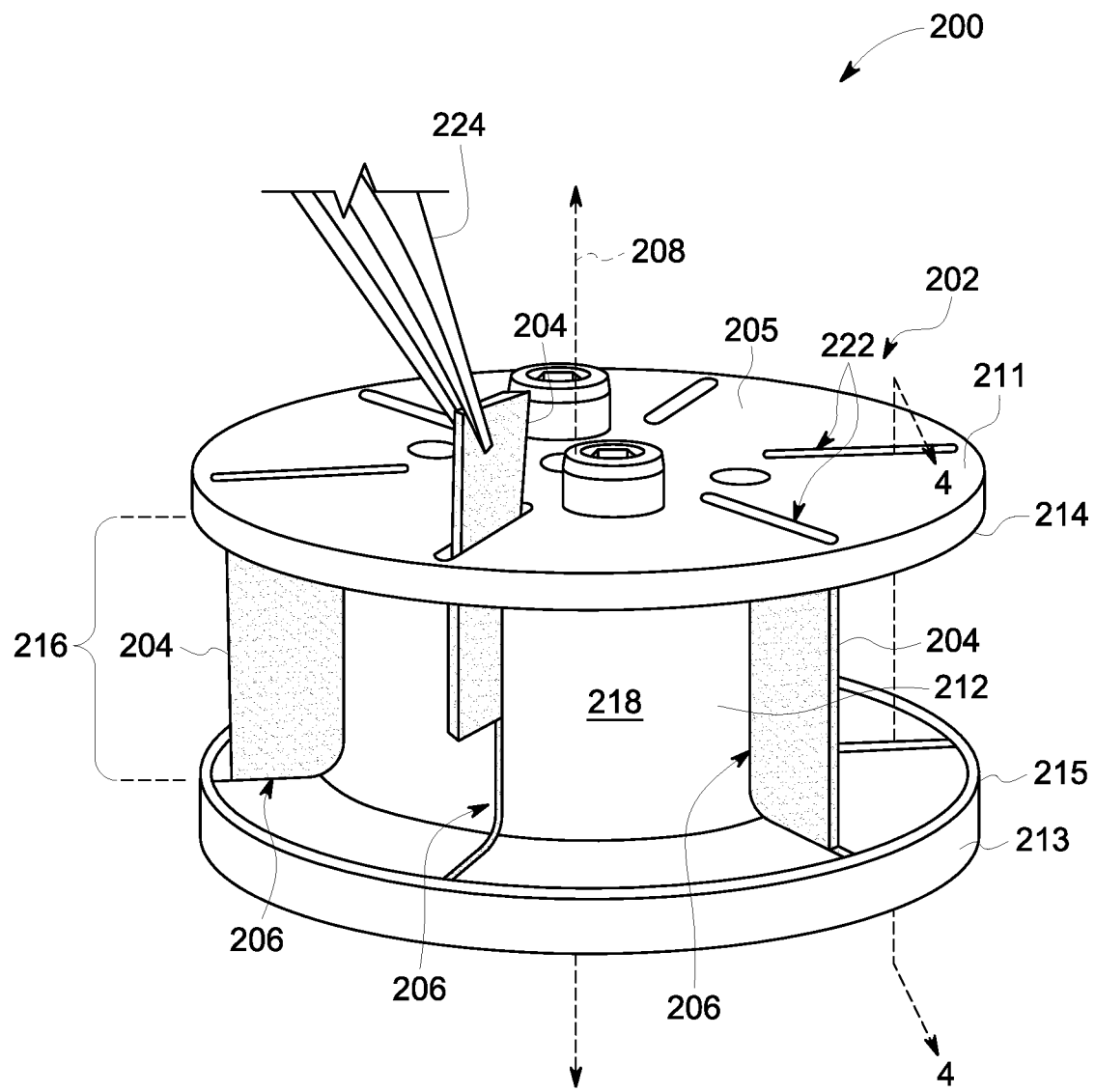
FIG. 3 is an enlarged perspective view of an extraction device that may be used with the particle accelerator of FIG. 1.

FIG. 3 is a perspective view of an extraction device 200 that may be used in a particle accelerator, such as the particle accelerator 102 (FIG. 1) of the nuclide production system 100 (FIG. 1). The extraction device 200 includes a foil holder 202 and a plurality of stripper foils 204. The extraction device 200 may also include a holder cover 210 (not shown).

In the illustrated embodiment, the foil holder 202 is configured to hold and position six (6) stripper foils 204 so that charged particles (not shown) from the particle accelerator may be incident upon the corresponding stripper foil 204. In other embodiments, the foil holder 202 may hold fewer stripper foils (e.g., only one stripper foil) or more stripper foils. The stripper foil 204 may be a substantially rectangular and thin sheet of suitable material, but other shapes may be used in other embodiments. For example, the stripper foil 204 may have a substantially circular profile. The stripper foil 204 may be similar or identical to the stripper foils formed in accordance with a method 300 (shown in FIG. 5).

The foil holder 202 includes a holder body 205 having a plurality of positioning slots 206 that are each sized and shaped to hold one of the stripper foils 204. The foil holder 202 may also include fasteners or other components and, in some embodiments, the stripper foils 204. In one or more embodiments, the positioning slots 206 are dimensioned to permit the stripper foils 204 to freely expand or contract within the positioning slot 206. The positioning slots 206 may be defined by interior reference surfaces (described below) that retain the stripper foils while also permitting edge portions of the stripper foils 204 to move relative to the reference surfaces. In such embodiments, forces experienced by the stripper foil, when not stripping electrons, may essentially be only gravity pulling the stripper foil against the interior reference surfaces. In other embodiments, however, the stripper foil may be physically compressed to more securely hold the stripper foil. The portion of the stripper foil that may be physically compressed may be a support section or frame as described below. Accordingly, the verb "hold," when used with respect to a stripper foil, includes the stripper foil resting within a positioning slot and being permitted to expand/contract, but also includes hardware (e.g., screw) or a tool (e.g., pinching device) that compresses a portion of the stripper foil between two surfaces.

For example, the holder body 205 may include body portions 211-213, including first and second plate portions 211, 213 and an intermediate portion 212 disposed between the plate portions 211, 213. In the illustrated embodiment, the holder body 205 is a single continuous piece of material. For example, the plate portions 211, 213 and the intermediate portion 212 may be molded and shaped from a common piece of material (e.g., graphite) to include the features described herein. In alternative embodiments, however, one or more of the plate portions 211, 213 or the intermediate portion 212 may be separate from the others. For example, each of the plate portions 211, 213 and the intermediate portion 212 may be a separate component that is secured to the other components to form the holder body 205.

In the illustrated embodiment, the foil holder 202 is configured to be rotated about an axis of rotation 208 to different designated rotational positions. As such, the plate portions 211, 213 and the intermediate portion 212 may have substantially circular cross-sections taken transverse to the axis of rotation 208. The plate portions 211, 213 may be referred to as discs in some embodiments. However, in other embodiments, the foil holder 202 or the body portions 211-213 are only partially circular (e.g., semi-circular). For example, instead of having circular cross-sections and being configured to hold six (6) stripper foils 204, the body portions 211-213 may have semi-circular cross-sections that are configured to hold only three (3) or four (4) stripper foils 204.

The holder body 205 includes a beam-receiving channel 216 that extends around the axis of rotation 208. The beam-receiving channel 216 is defined by the plate portions 211, 213 and the intermediate portion 212. As shown, the beam-receiving channel 216 opens radially outward from the axis of rotation 208 such that the beam-receiving channel 216 is open-sided. The beam-receiving channel 216 is defined by an exterior channel surface 218. The channel surface 218 extends along the plate portions 211, 213 and the intermediate portion 212. As shown in FIG. 2, the positioning slots 206 are formed within the channel surface 218.

In the illustrated embodiment, the channel surface 218 is a single continuous surface that extends from a radial edge 214 of the plate portion 211 along the intermediate portion 212 to a radial edge 215 of the plate portion 213. For embodiments in which the body portions 211-213 are separate components, however, the channel surface 218 may be collectively formed by separate surfaces of the components. Accordingly, the term "channel surface" may describe a single continuous surface that defines the beam-receiving channel 216 or multiple surfaces that collectively define the beam-receiving channel 216.

As shown in FIG. 2, the plate portion 211 may include a plurality of elongated slot openings 222. The slot openings 222 provide access to corresponding positioning slots 206. For example, as shown in FIG. 2, a tool 224 (e.g., pliers) may be used to insert the stripper foils 204 through the slot openings 222 and into the respective positioning slots 206. As the stripper foils 204 are advanced through the positioning slots 206, the stripper foil 204 advances across the beam-receiving channel 216. After the stripper foil 204 has been inserted into the positioning slot 206, the stripper foil 204 is disposed transverse to the beam-receiving channel 216 such that the stripper foil 204 separates or divides the beam-receiving channel 216. Once the desired number of stripper foils 204 have been positioned within the holder body 205, a holder cover (not shown) may be mounted to the plate portion 211 thereby covering the slot openings 222 so that the stripper foils 204 are confined within the positioning slot 206.

Figure 4:
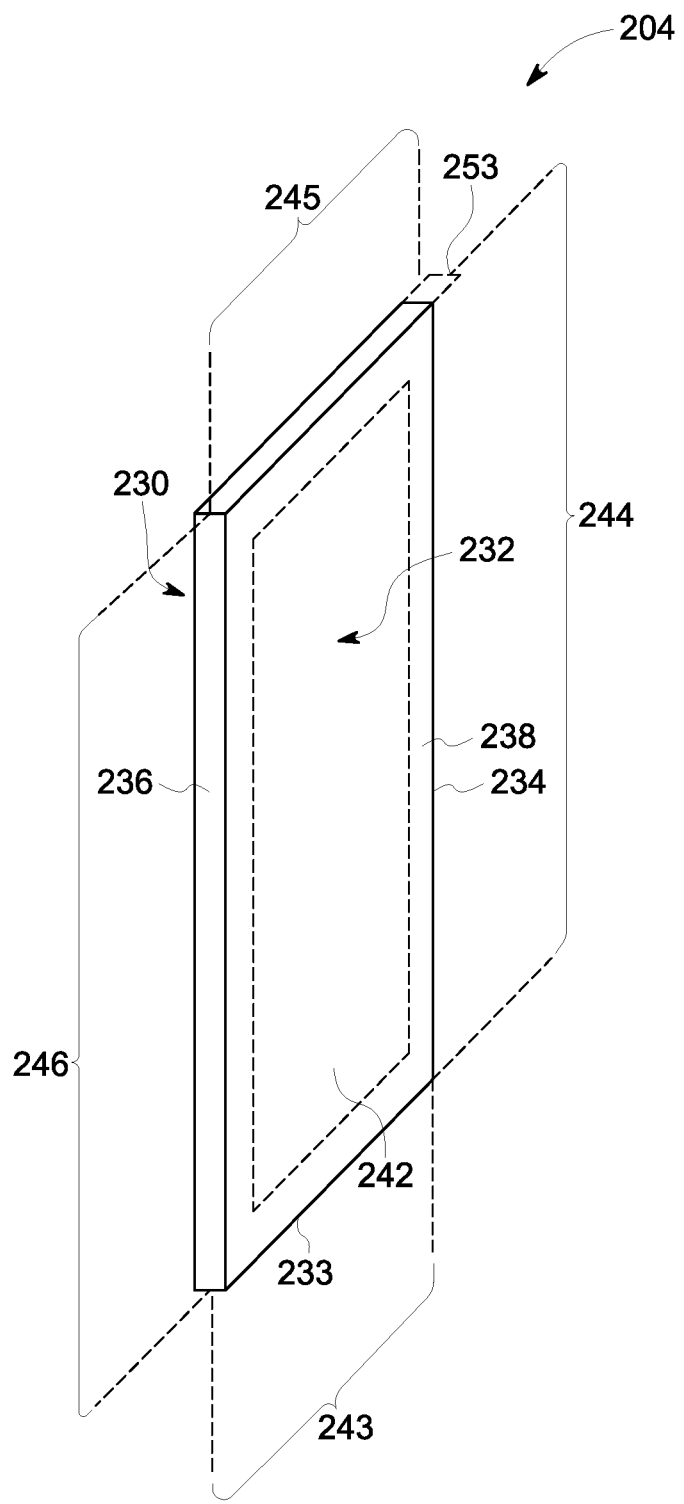
FIG. 4 is a perspective view of a stripper foil that may be used by one or more embodiments described herein.

FIG. 4 illustrates an exemplary stripper foil 204 that may be used by embodiments described herein. In FIG. 4, dimensions of the stripper foil 204 have been modified for illustrative purposes. Nonetheless, it is understood that embodiments may be selectively configured to utilize a stripper foil having predetermined dimensions or to utilize various types of stripper foils. As shown, the stripper foil 204 includes opposite side surfaces 230, 232 and foil edges 233-236 that extend between the opposite side surfaces 230, 232. In FIG. 4, the side surfaces 230, 232 are shown as being substantially planar and the foil edges 233-236 are shown as being substantially linear. It is understood, however, that stripper foils may readily yield (e.g., bend) when external forces are applied and may be shaped to have various contours. The foil edges 233-236 extend along a perimeter of the stripper foil 204 and may define a profile of the stripper foil 204 when the stripper foil 204 is substantially planar. The profile in FIG. 4 is substantially rectangular, but the stripper foil 204 may have other profiles in other embodiments.

As shown, the stripper foil 204 includes an edge portion 238 that extends around the perimeter of the stripper foil 204. The edge portion 238 is defined between the broken line and the foil edges 233-236 in FIG. 4. The edge portion 238 includes the foil edges 233-236 and also a portion of the side surfaces 230, 232. The edge portion 238 may include at least one covered segment and at least one exposed segment. For example, the edge portion 238 includes covered segments 243-245 which extends along and includes the foil edges 233-235, respectively. The covered segments 243-245 may collectively form a C shape. The edge portion 238 also includes an exposed segment 246 that extends along and includes at least a portion of the foil edge 236.

In the illustrated embodiment, the edge portion 238 surrounds a body portion 242 of the stripper foil 204. When the stripper foil 204 is retained with the corresponding positioning slot 206 (FIG. 3), the body portion 242 and the exposed segment 246 of the edge portion 238 are exposed. For example, the body portion 242 and the exposed segment 246 are not covered by the holder body 205 (FIG. 3) and are capable of directly receiving charged particles (not shown). Also shown in FIG. 4, the stripper foil 204 may have a height or thickness 253 that extends between the side surfaces 230, 232.

Figure 5:
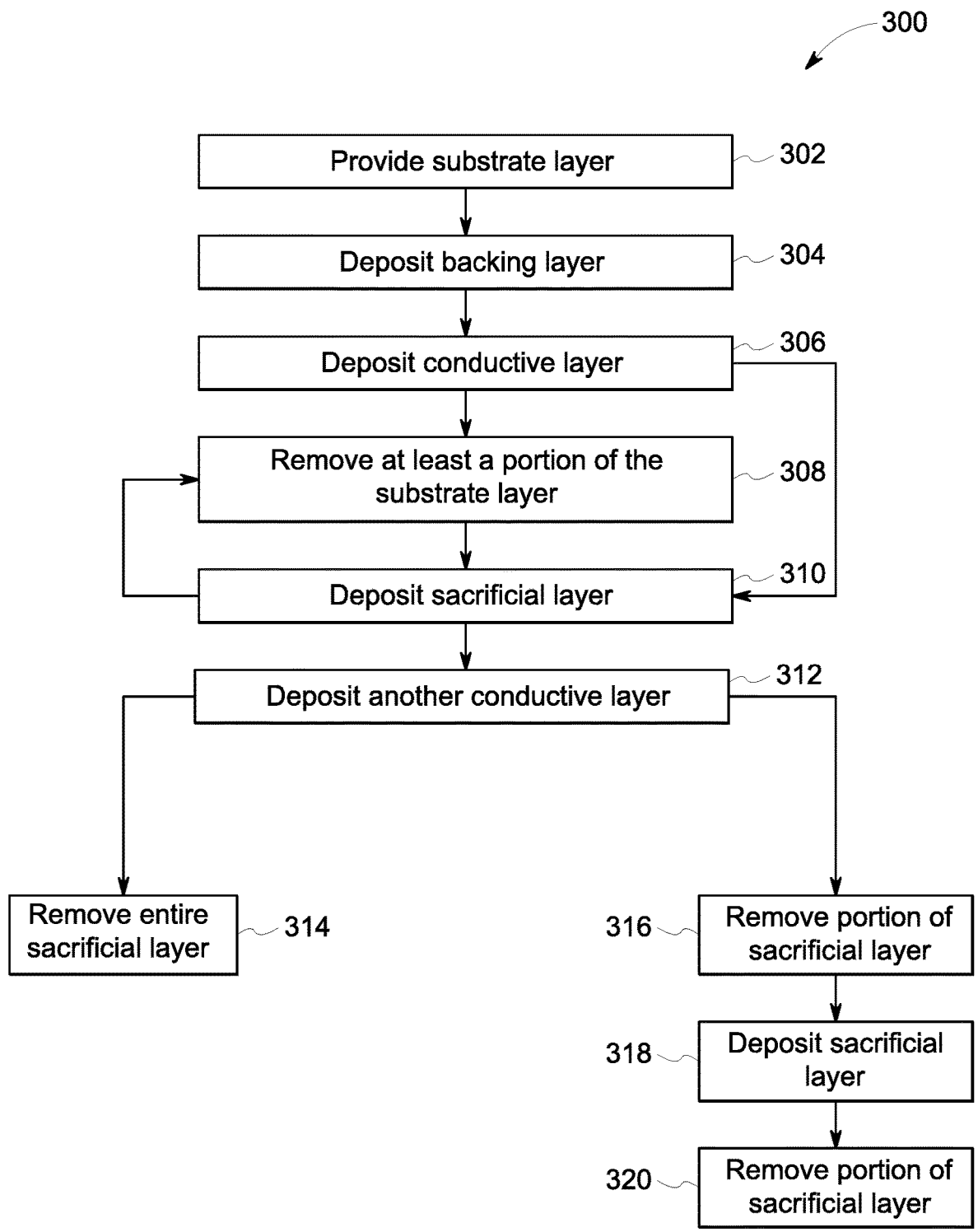
FIG. 5 is a flow chart illustrating a method in accordance with an embodiment.

FIG. 5 is a flow chart illustrating a method 300 in accordance with an embodiment. In some embodiments, the method 300 is a method of fabricating or at least partially fabricating a stripper foil configured to remove electrons from a beam of charged particles. The stripper foil may be used in the system 100 (FIG. 1). In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

Figure 6:
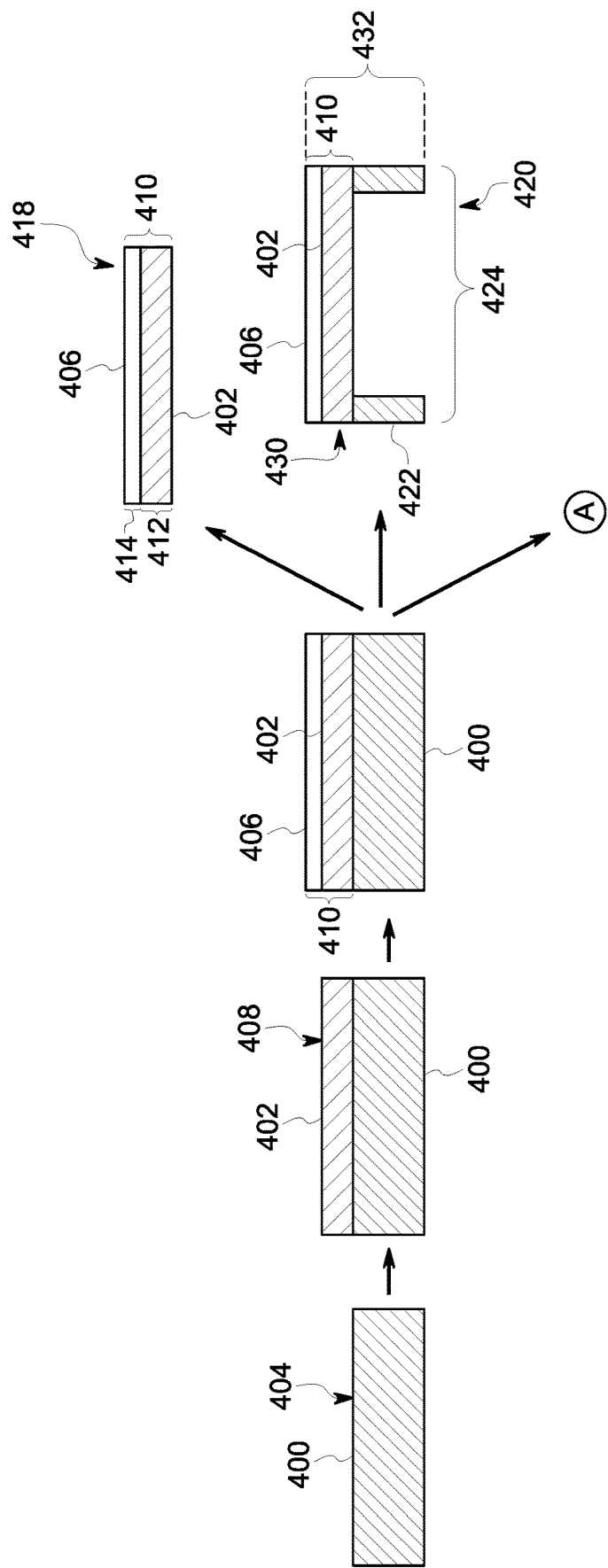
FIG. 6 illustrates at least some of the stages of the method of FIG. 5.

The method 300 is described with reference to FIGS. 6-9. With reference to FIGS. 5 and 6, the method 300 includes providing, at 302, a substrate layer 400. The substrate layer 400 may be, for example, a silicon wafer. The substrate layer 400 may include one or more sub-layers. The method 300 also includes depositing, at 304, a backing layer 402 along an exposed side 404 of the substrate layer 400. The backing layer 402 comprises synthetic diamond or, in other words, not naturally-occurring diamond. The synthetic diamond may have an $sp^3$-hybridized configuration or structure.

Processes that may be used to deposit the backing layer 402 include CVD (e.g., thermal CVD, atomic layer deposition, plasma CVD, DC discharge, radio-frequency (RF) CVD, microwave CVD, flame (combustion) CVD, or hot-filament CVD, or a combination of the above). CVD processes involve chemical reactions inside a gas-phase and deposition onto a substrate layer. Various parameters may be selected for tuning the process, such as the plasma discharge power (if applicable), composition of a reactant gas, composition of the substrate, temperature of the substrate, electrical bias of the substrate, temperature of the filament (if applicable), flow rate of the reactant gas, and/or pressure of the system. Reactant gases including a carbon-containing gas species, among other gases. Reactant gases that may be used include hydrogen, oxygen, methane, carbon dioxide, argon, and nitrogen. Deposition may be thermally assisted (e.g., hot filaments or hot arcs) or microwave plasma assisted.

The method 300 also includes depositing, at 306, a conductive layer 406 (e.g., graphite layer) along an exposed side 408 of the backing layer 402 such that the backing layer 402 is disposed between the substrate layer 400 and the conductive layer 406. For embodiments that include multiple conductive layers, the conductive layer 406 may be referred to as the first conductive layer.

The depositing, at 306, may use the same deposition process as the deposition process at 304. For example, the conductive layer 406 may be deposited using CVD, such as microwave CVD, hot filament CVD, and arc discharge CVD. Other additive processes, however, may be used to deposit the conductive layer 406, such as evaporation or sputtering. In some embodiments, the synthetic diamond is a polycrystalline diamond (e.g., $sp^3$-hybridized) and the conductive layer comprises an electrically-conductive carbon layer. The conductive layer is sufficiently conductive for providing a path to ground, thereby increasing a lifetime usage of the stripper foil. The electrically-conductive carbon layer may include, for example, graphite, graphene, amorphous carbon, or diamond-like carbon (DLC). The electrically-conductive carbon layer may be doped. For example, the carbon layer may be doped with boron to enhance mechanical properties, such as mechanical strength or potentially stress reduction. In particular embodiments, the electrically-conductive carbon layer is graphite.

The conductive layer and the backing layer may be joined using graded layers. In such embodiments, an intermediate graded layer may enhance adhesion of the conductive layer to the backing layer.

The backing and conductive layers 402, 406 form a stripping sheet 410 that is configured to strip electrons from a beam of charged particles passing through the stripping sheet 410. As shown in FIG. 6, the backing layer 402 has a thickness 412, and the conductive layer 406 has a thickness 414. The thickness 414 of the conductive layer 406 may be about equal to or smaller than the thickness 412 of the backing layer 402. For example, the thickness 414 of the conductive layer 406 may be at most 2000 nanometers (nm), although a thicker conductive layer 406 is possible. In particular embodiments, the thickness 414 is between 1 nm and 1000 nm. In more particular embodiments, the thickness 414 is between 1 nm and 500 nm or 1 nm and 300 nm. It is contemplated that thinner conductive layers 406, such as 500 nm or less, may cause less cyclical stresses experienced by the stripper foil. However, embodiments may have conductive layers that are thicker than 500 nm.

The thickness 412 of the backing layer 402 may be, for example, at least 0.5 micrometers (microns) (or 500 nm), at least 1 micron, at least 2 microns, or at least 3 microns. In some embodiments, the thickness 412 of the backing layer 402 may be at least 5 microns or at least 10 microns. In particular embodiments, the thickness 412 may be at most 50 microns. A range of the thickness 412 may be between 0.5 microns and 20 microns. A more particular range of the thickness 412 may be between 0.5 microns and 10 microns.

The method 300 also includes removing, at 308, at least a portion of the substrate layer 400. The substrate layer 400 may be removed by etching or using another subtractive process. Optionally, the substrate layer 400 may be entirely removed to form a stripper foil 418. Alternatively, only a sacrificial portion of the substrate layer 400 is removed to form a stripper foil 420. A remaining portion 422 of the substrate layer 400 may form a support frame 424. The stripping sheet 410 and the support frame 424 define the stripper foil 420. The support frame 424 may also be referred to as a support section in some embodiments.

The support frame 424 may have a designated pattern or shape. For example, the stripping sheet 410 has an outer edge 430 that is formed by the backing layer 402 and the conductive layer 406. The support frame 424 may be patterned such that the support frame 424 extends along the outer edge 430. For example, the support frame 424 may be flush with the outer edge 430 (as shown in FIG. 6) or immediately adjacent to the outer edge 430 such that a small portion of the stripping sheet 410 clears the support frame 424. Collectively, the stripping sheet 410 and the support frame 424 define a foil edge 432 of the stripper foil 420. The support frame 424 may enhance mechanical properties of the stripper foil 420.

In an alternative embodiment, the conductive layer may be formed prior to the backing layer. For example, a graphite layer may be deposited onto a base substrate, and a diamond layer may be deposited onto the graphite layer. The base substrate may be subsequently removed (entirely or partially to form a support section) as described above. Optionally, an intermediate layer may be deposited there between. For example, a metal layer (e.g., titanium or platinum) may be used to improve adhesion. Subsequently, a diamond layer may be deposited onto the intermediate layer. The intermediate layer and the diamond layer may be fabricated consecutively using a common CVD apparatus.

Figure 7:
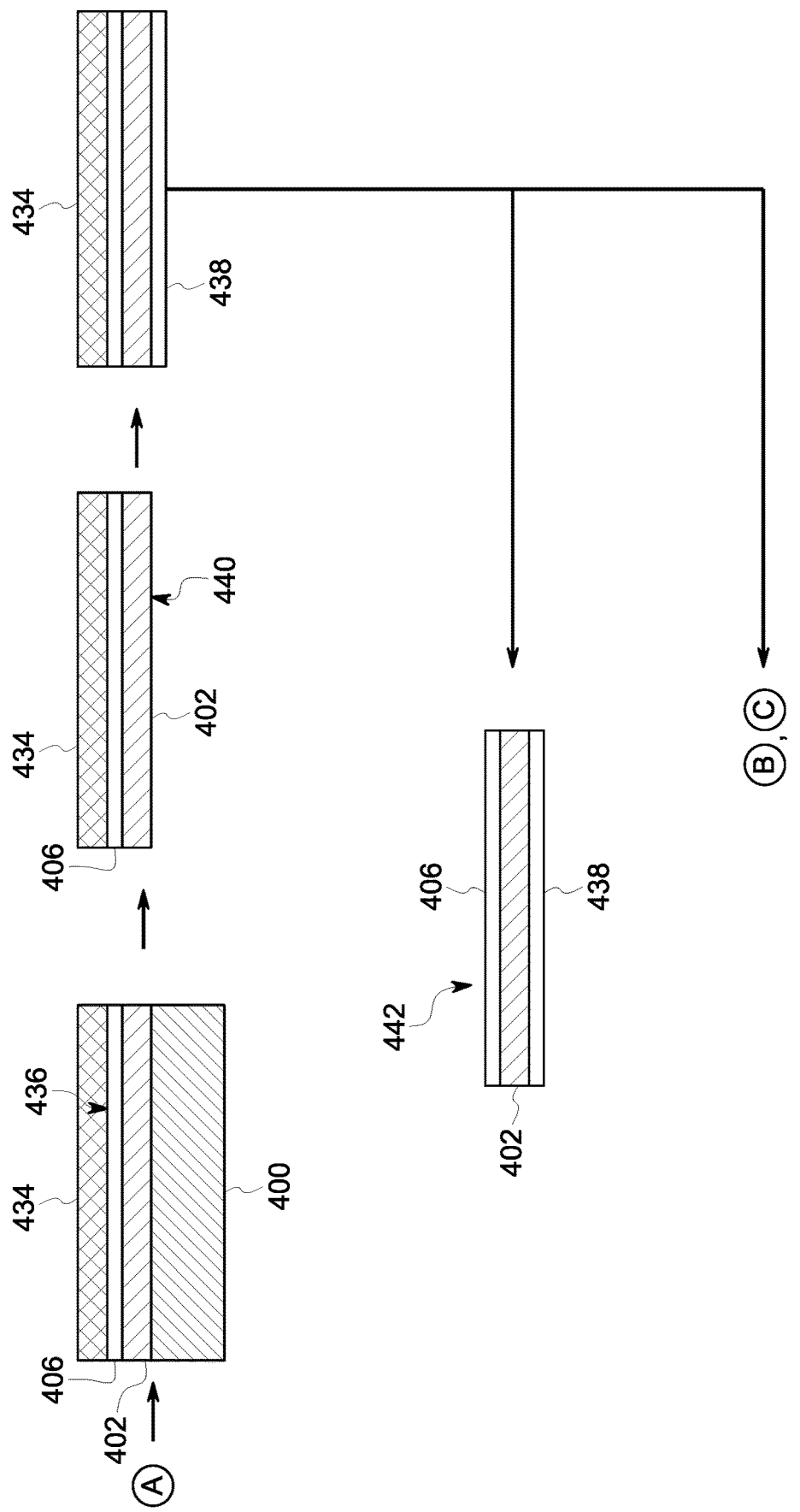
FIG. 7 illustrates optional stages of the method of FIG. 5 in which a second conductive layer is added to the stripper foil.

FIG. 7 illustrates another optional stage of the method 300. Before or after removing, at 308, at least a portion of the substrate layer 400, the method 300 may include depositing, at 310, a sacrificial layer 434 along an exposed side 436 of the conductive layer 406. The sacrificial layer, or other layers of the stripper foil, may be selected to have a coefficient of thermal expansion such that the stripper foil experiences less cyclical stress caused by the heating and cooling of the stripper foil. Other parameters selected may include a thickness or two-dimensional profile of the conductive layer. The design of the support section may also be selected to increase the lifetime of the stripper foil. The sacrificial layer 434 may be, for example, a material that has a coefficient of thermal expansion that is approximately equal to a coefficient of thermal expansion of the material of the backing layer 402 and/or a material of the conductive layer 406. As one example, the sacrificial layer 434 may comprise boron nitride (BN).

Returning to FIG. 7, if the substrate layer 400 remains, the substrate layer 400 may be removed, at 308. At 312, another conductive layer 438 may be deposited along an exposed side 440 of the backing layer 402. The other conductive layer 438 (or second conductive layer 438) may comprise an identical material as the conductive layer 406 or a different material.

Optionally, the sacrificial layer 434 may be entirely removed at 314 to form a stripper foil 442 having the conductive layers 406, 438 on opposite sides with the backing layer 402 disposed therebetween.

Embodiments having the backing layer 402 disposed between the conductive layers 406, 438 may experience symmetrical internal stresses. More specifically, as the backing layer 402 and conductive layers 406, 438 expand due to an increase in thermal energy, an interface 460 between the backing layer 402 and the conductive layer 406 may experience internal stress caused by the expanding two layers. Likewise, an interface 462 between the backing layer 402 and the conductive layer 438 may experience internal stress caused by the expanding two layers. For embodiments in which the two interfaces 460, 462 exist, the internal stresses along the interface 460 may resist deformation of the stripper foil caused by the internal stresses along the interface 462 and vice versa. Such embodiments may have a longer lifetime compared to embodiments having only one conductive layer and/or may have a more consistent performance compared to embodiments having only one conductive layer.

Figure 8:
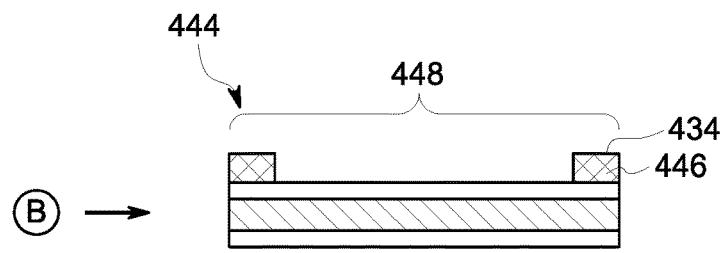
FIG. 8 illustrates optional stages of the method of FIG. 5 in which a support section is added to the stripper foil.

Alternatively, as shown in FIG. 8, the sacrificial layer 434 may be only partially removed at 316 to form a stripper foil 444. For example, the sacrificial layer may be removed through photolithography or etching. A remaining portion 446 of the sacrificial layer 434 may form a support frame 448 of the stripper foil 444.

Figure 9:
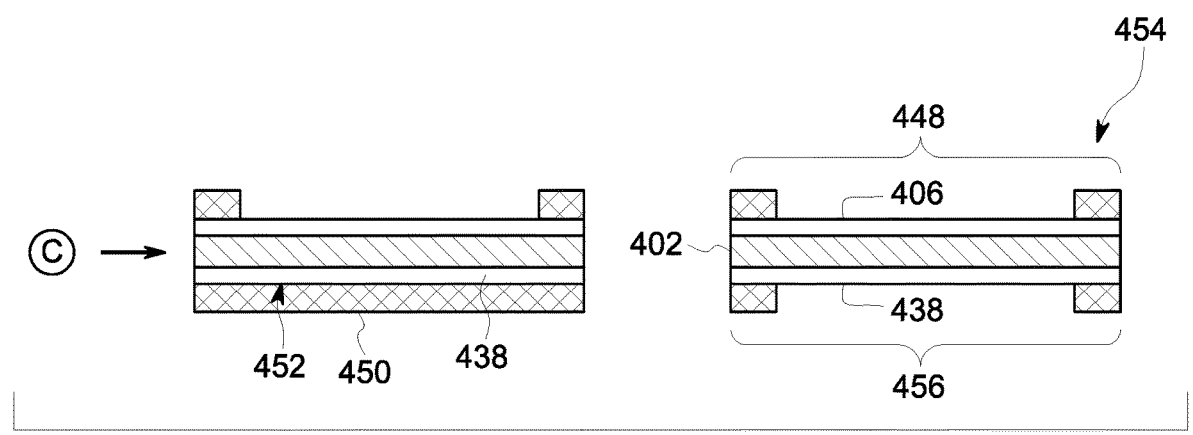
FIG. 9 illustrates optional stages of the method of FIG. 5 in which a support section is added to an opposite side of the stripper foil.
Figure 10:
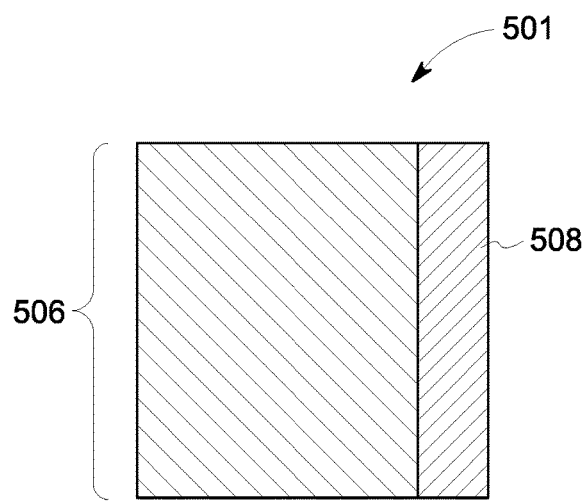
FIG. 10 illustrates a plan view of a stripper foil in accordance with an embodiment having a support section along one outer edge.
Figure 11:
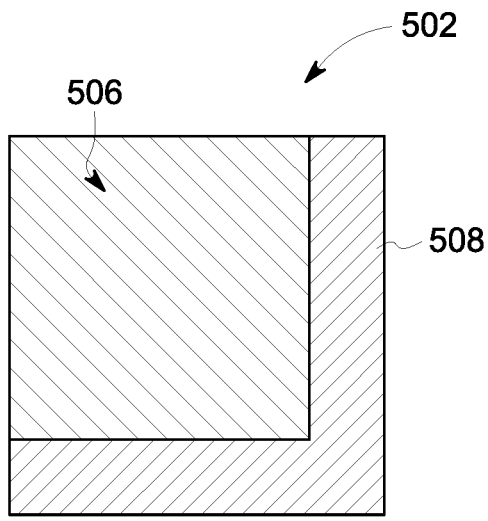
FIG. 11 illustrates a plan view of a stripper foil in accordance with an embodiment having a support section along multiple outer edges.
Figure 12:
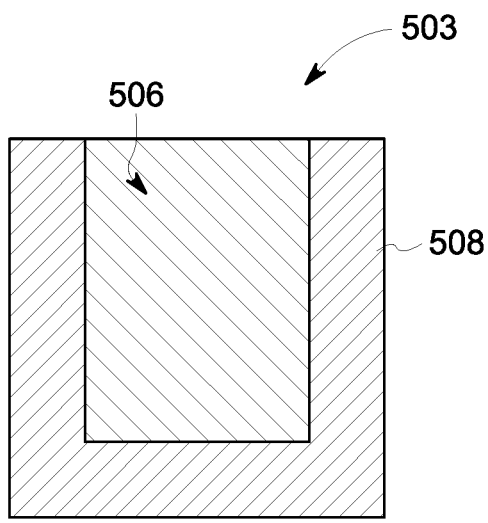
FIG. 12 illustrates a plan view of a stripper foil in accordance with an embodiment having a support section along multiple outer edges.
Figure 13:
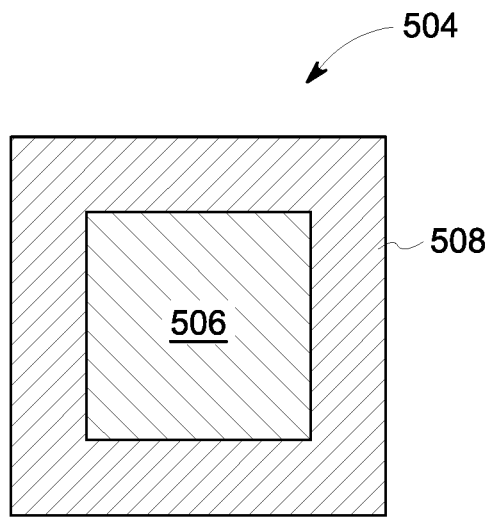
FIG. 13 illustrates a plan view of a stripper foil in accordance with an embodiment having a rectangular-shaped window.
Figure 14:
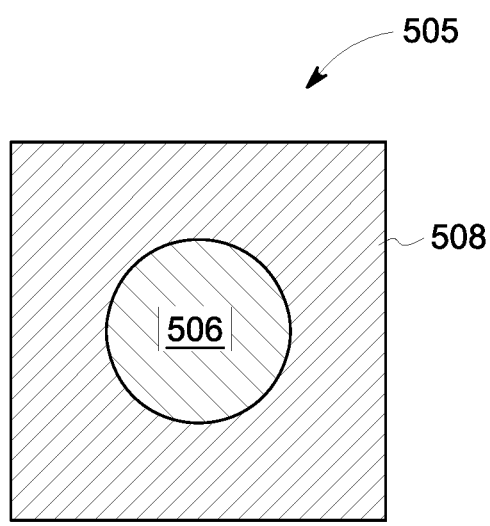
FIG. 14 illustrates a plan view of a stripper foil in accordance with an embodiment having a circular-shaped window.

FIG. 9 illustrates another optional stage of the method 300. After partially removing, at 316, the sacrificial layer 434, the method 300 may include depositing, at 318, another sacrificial layer 450 (or second sacrificial layer) along an exposed side 452 of the conductive layer 438. At 320, the other sacrificial layer 450 may be partially removed to form a stripper foil 454. As shown in FIG. 9, the stripper foil 454 includes the support frame 448 and a support frame 456 on opposite sides of the stripper foil 454. Embodiments having the backing layer 402 disposed between the conductive layers 406, 438 and the support frames 448, 456 may also experience symmetrical internal stresses as described above.

Figure 15:
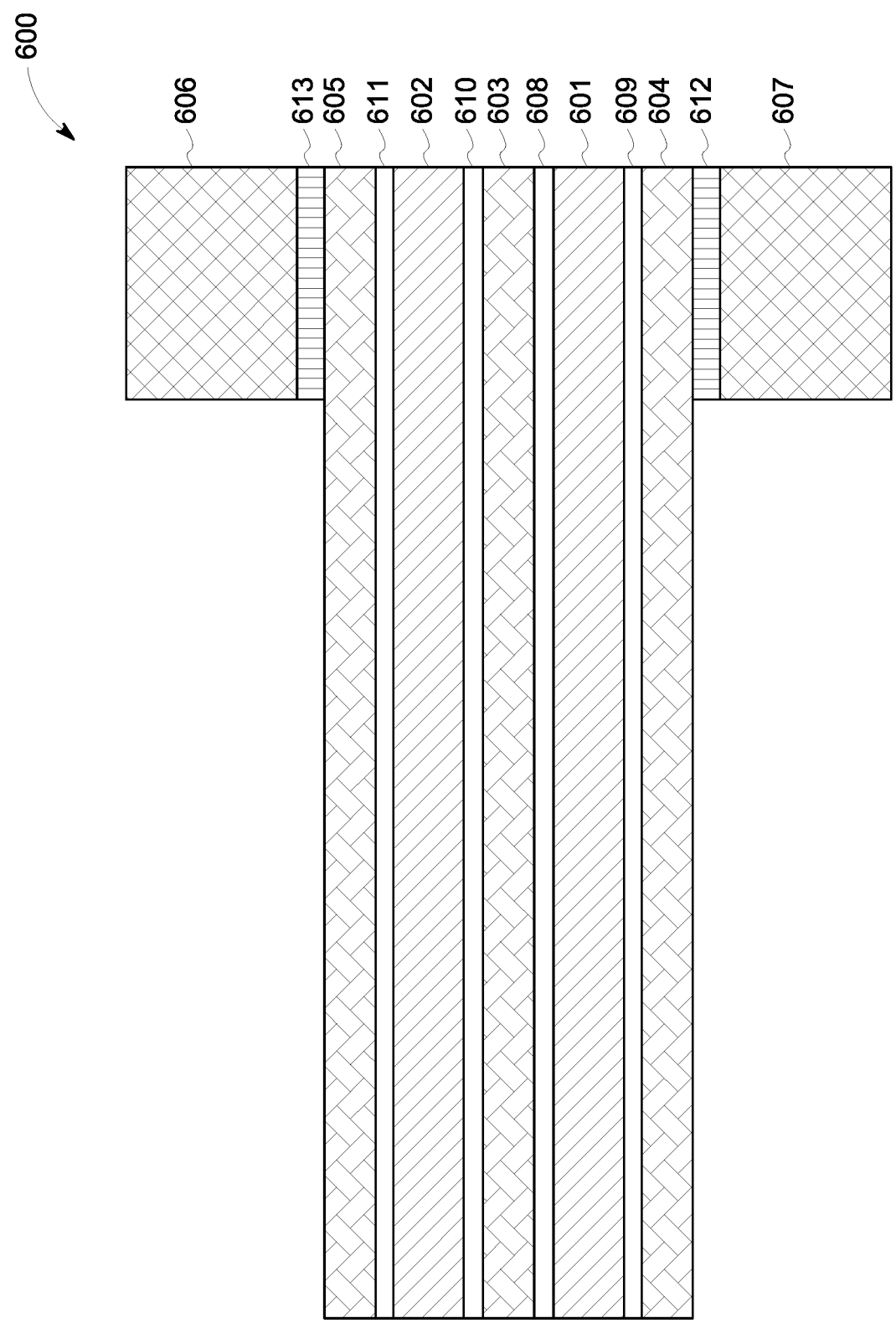
FIG. 15 is a side view of a stripper foil formed in accordance with an embodiment.

FIG. 15 is a side view of a stripper foil 600 formed in accordance with an embodiment. As shown, the stripper foil 600 includes multiple backing layers 601, 602, conductive layers 603, 604, 605, and support sections 606, 607. Optionally, the stripper foil 600 includes intermediate layers 608, 609, 610, 611, 612, and 613. The stripper foil 600 may be fabricated using, for example, the method 300 (FIG. 3). For example, the various layers may be deposited on one another as shown in FIGS. 6-9. The intermediate layers may include, for example, carbide (e.g., cubic silicon carbide (β-SiC)), amorphous $SiO_2$ or titanium and be applied using similar techniques as set forth above, such as CVD.

The optional intermediate layers 608-613 may be configured to provide the stripper foil 600 with a designated property. For example, one or more of the intermediate layers 608-611 may enhance a structural integrity of the stripper foil 600 and/or increase a lifetime operation of the stripper foil 600.

In some embodiments, one or more of the intermediate layers 608-611 may be configured to improve adhesion between the two layers on opposite sides of the intermediate layer. For example, the intermediate layer 608 may increase adhesion between the backing layer 601 and the conductive layer 603 compared to a configuration that does not include the intermediate layer 608.

In particular embodiments, one or more of the intermediate layers 608-613 are graded layers in which the apparatus (e.g., CVD system) that applies the backing layer and/or the conductive layer also applies the intermediate layer. During deposition of the layers, one or more of the parameters for depositing material may be gradually changed such that different layers are applied consecutively by the same apparatus. As used herein, the term "gradually changed" may include abrupt changes in a parameter or continuous changes in a parameter. As one example, an abrupt change may include depositing material at a designated pressure for a time period and then depositing material at a different designated pressure for a subsequent time period. An abrupt change may also include changing the gas composition such that the gas compositions at the different time periods are different. The deposition process for the backing layer 601 may be at a first set of parameters, the deposition process for the intermediate layer 608 may be at a different second set of parameters, and the deposition process for the conductive layer 603 may be at a different third set of parameters.

A continuous change may include increasing (or decreasing) a parameter from one value to another value over a time period. The increase or decrease may be at a constant rate or at a non-linear rate.

In alternative embodiments, the exposed surface of the backing layer may be physically or chemically processed prior to the conductive layer being deposited along the surface. The processed surface may cause an intermediate layer to develop when material is deposited along the surface. In alternative embodiments, the intermediate layer 602 may be deposited using a different type of deposition process.

Also shown in FIG. 15, a stripper foil may include intervening (or interleaving) backing layers, conductive layers, and (optionally) intermediate layers. In particular embodiments, the same apparatus may provide each of the layers. For example, the deposition process for the backing layer 601 may be at a first set of parameters, the deposition process for the intermediate layer 608 may be at a different second set of parameters, and the deposition process for the conductive layer 603 may be at a different third set of parameters. The deposition process for the intermediate layer 610 may be at the second set of parameters, the deposition process for the backing layer 602 may be at the first set of parameters, and so on.

In the above example, the backing layer is provided prior to the conductive layer. It is also contemplated that the conductive layer may be provided prior to the backing layer. For example, a graphite layer may be deposited on a base substrate. A diamond layer may then be deposited onto the graphite layer. Optionally, an intermediate layer may be provided onto the graphite layer prior to the diamond layer being applied.

In other embodiments, the stripper foil may include discrete sections that are stacked together to form the stripper foil. For example, the layers 601, 609, 604, 612, and 607 may constitute a first foil section, and the layers 608, 603, 610, 602, 611, 605, 613, and 606 may constitute a second foil section. The first and second foil sections may be sandwiched together during operation.

FIGS. 10-14 illustrate plan views of stripper foils 501, 502, 503, 504, and 505, respectively. Each of the stripper foils 501-505 defines a window 506 and a support section or frame 508. The window 506 represents a portion of the stripper foil that the charged particle are configured to pass through so that electrons of the charged particles may be stripped. The window 506 is a portion of a stripping sheet, such as the stripping sheet 410 (FIG. 6), which includes a backing layer and at least one conductive layer. The window 506 has a designated shape that may be at least partially defined by the support frame 508. For example, the stripper foils 501-504 have rectangular-shaped windows. The stripper foil 505, however, has a circular-shaped window. It should be understood that the support frame may be patterned to form a variety of predetermined shapes.

Figure 16:
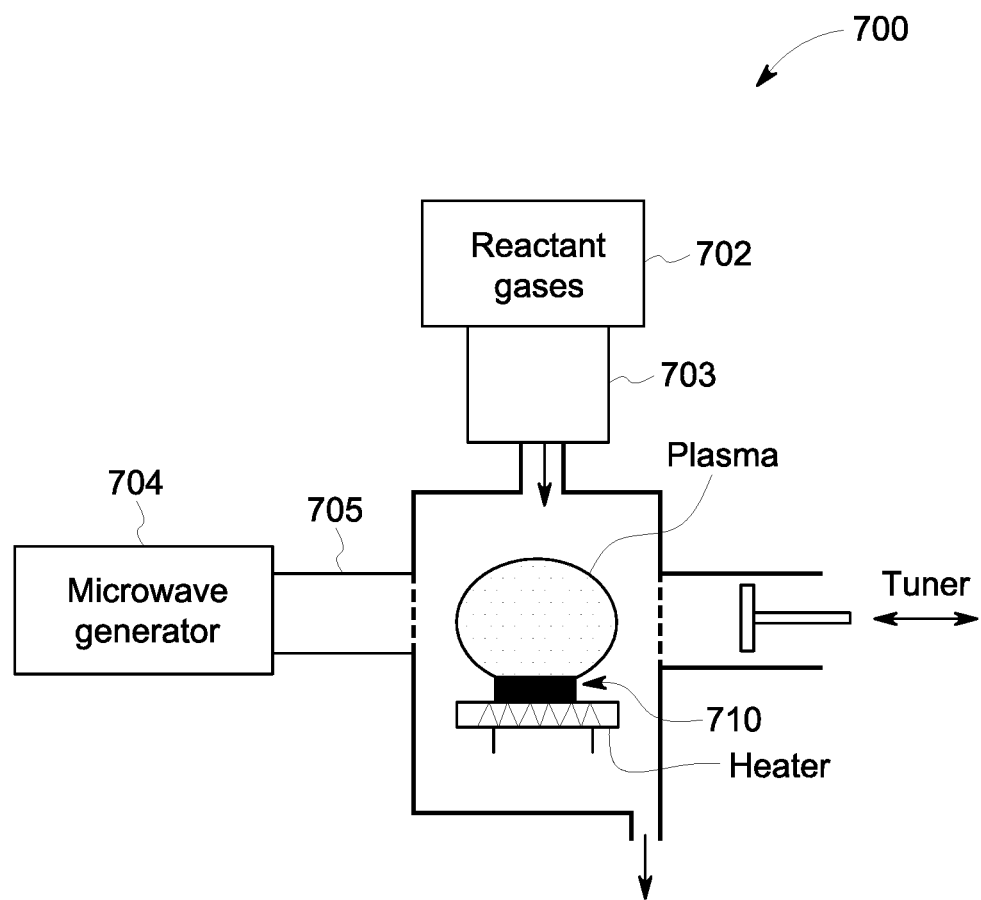
FIG. 16 is a schematic view of a deposition apparatus in accordance with an embodiment.

FIG. 16 is a schematic view of a deposition apparatus 700. In particular embodiments, the deposition apparatus 700 is a microwave-plasma CVD apparatus or system that is configured to deposit one or more layers on a substrate layer 710. The deposited layers may include the backing layers, conductive layers, and intermediate layers described herein. In particular embodiments, the deposition apparatus 700 may deposit consecutive layers by adjusting operating parameters of the deposition apparatus 700. As shown, the deposition apparatus 700 includes one or more vessels 702 for reactant gases and one or more flow rate controllers 703 disposed between the vessels 702 and a chamber where the deposition occurs. The deposition apparatus 700 also includes a microwave generator 704 and a waveguide 705. It should be understood, however, that other deposition apparatuses may be used.

In particular embodiments, the particle accelerators and cyclotrons are sized, shaped, and configured for use in hospitals or other similar settings to produce radioisotopes for medical imaging. However, embodiments described herein are not intended to be limited to generating radioisotopes for medical uses. Furthermore, in the illustrated embodiments, the particle accelerators are vertically-oriented isochronous cyclotrons. However, alternative embodiments may include other kinds of cyclotrons or particle accelerators and other orientations (e.g., horizontal).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system comprising:
a particle accelerator configured to direct a particle beam of charged particles along a designated path; and
an extraction device positioned downstream from the particle accelerator, the extraction device including a stripper foil and a foil holder that holds the stripper foil, the foil holder configured to position the stripper foil across the designated path of the particle beam such that the particle beam is incident thereon, the stripper foil configured to remove electrons from the charged particles, wherein the stripper foil includes a backing layer and a conductive layer stacked with respect to one another, the backing layer comprising synthetic diamond, the stripper foil further comprising an intermediate layer positioned between the backing layer and the conductive layer, the intermediate layer comprising metal that increases adhesion between the backing layer and the conductive layer.

2. The system of claim 1, wherein the conductive layer is deposited directly along the synthetic diamond or on an intermediate layer between the conductive layer and the synthetic diamond.

3. The system of claim 2, wherein the synthetic diamond is a polycrystalline diamond ($sp^3$-hybridized) and the conductive layer comprises electrically-conductive carbon layer.

4. The system of claim 1, wherein the stripper foil has an outer edge and further comprises a support section layer extending along at least a portion of the outer edge, the support section layer formed directly on the conductive layer or directly on an intermediate layer between the support section layer and the conductive layer, the support section layer allowing the charged particles to pass through the conductive layer and the backing layer.

5. The system of claim 1, wherein the conductive layer is a first conductive layer, the stripper foil further comprising a second conductive layer, wherein the backing layer is disposed between the first and second conductive layers.

6. A stripper foil comprising:
a conductive layer; and
a backing layer stacked with respect to the conductive layer, the backing layer comprising synthetic diamond, the conductive and backing layers forming a stripping sheet that is configured to strip electrons from charged particles passing through the stripping sheet; and
wherein the stripping sheet has an outer edge formed by the conductive layer and the backing layer, the stripper foil further comprising a support section layer extending along at least a portion of the outer edge, the support section layer covering only a portion of the stripping sheet thereby allowing the charged particles to pass through the conductive layer and the backing layer, the support section layer being formed on the stripping sheet.

7. The stripper foil of claim 6, wherein the conductive layer is deposited directly on the synthetic diamond or directly on an intermediate layer between the conductive layer and the synthetic diamond.

8. The stripper foil of claim 6, wherein the conductive layer has a thickness that is at most 2000 nanometers and the backing layer has a thickness that is at most 50 micrometers.

9. The stripper foil of claim 6, wherein the conductive layer comprises an electrically-conductive carbon layer.

10. The stripper foil of claim 6, further comprising an intermediate layer positioned between the backing layer and the conductive layer, the intermediate layer increasing adhesion between the backing layer and the conductive layer, wherein the intermediate layer and the conductive layer are carbon layers being consecutively deposited by a same deposition apparatus.

11. The stripper foil of claim 6, wherein the backing layer and the conductive layer are CVD-deposited layers that are deposited by a same CVD-deposition apparatus.

12. The stripper foil of claim 11, further comprising an intermediate layer positioned between the backing layer and the conductive layer, the intermediate layer increasing adhesion between the backing layer and the conductive layer, wherein the intermediate layer is a CVD-deposited layer.

13. The stripper foil of claim 11, wherein the conductive layer is an electrically-conductive carbon layer that includes at least one of graphite, graphene, amorphous carbon, or diamond-like carbon (DLC).

14. The stripper foil of claim 6, wherein the metal comprises titanium or platinum.

15. A stripper foil comprising:
a conductive layer;
a backing layer stacked with respect to the conductive layer, the backing layer comprising synthetic diamond, the conductive and backing layers forming a stripping sheet that is configured to strip electrons from charged particles passing through the stripping sheet; and
wherein the conductive layer is a first conductive layer, the stripping sheet further comprising a second conductive layer, wherein the backing layer is disposed between the first and second conductive layers; and
at least one intermediate layer positioned between the backing layer and the first conductive layer and/or the backing layer and the second conductive layer.

16. The stripper foil of claim 15, wherein the synthetic diamond is a polycrystalline diamond ($sp^3$-hybridized) and at least one of the first conductive layer or the second conductive layer comprises an electrically-conductive carbon layer.

17. The stripper foil of claim 15, further comprising a support frame layer deposited directly on at least one of the first conductive layer or the second conductive layer or directly on an intervening layer positioned between the support frame layer and the respective conductive layer.

* * * * *